(12) United States Patent
Park et al.

(10) Patent No.: US 7,337,079 B2
(45) Date of Patent: Feb. 26, 2008

(54) TIME-FREQUENCY DOMAIN REFLECTOMETRY APPARATUS AND METHOD

(75) Inventors: Jin-Bae Park, 106-2304, Ilshin Kunyoung Apt. 198, Tanhyeon-dong, Ilsan-gu, Goyang-si, Gyeonggi-do 411-320 (KR); Yong-June Shin, 2-907, Daegyo Apts., Yeouido-dong, Yeongdeungpo-gu, Seoul 150-010 (KR); Jong-Gwan Yook, Seoul (KR); Edward J. Powers, Austin, TX (US); Eun-Seok Song, Seoul (KR); Joo-Won Kim, Seoul (KR); Tok-Son Choe, Chungcheongbuk-do (KR); Seung-Hoon Sung, Seoul (KR)

(73) Assignees: Jin-Bae Park, Goyang-si (KR); Yong-June Shin, Seoul (KR)

( * ) Notice: Subject to any disclaimer, the term of this patent is extended or adjusted under 35 U.S.C. 154(b) by 70 days.

(21) Appl. No.: 10/519,414

(22) PCT Filed: Jul. 7, 2003

(86) PCT No.: PCT/KR03/01336

§ 371 (c)(1),
(2), (4) Date: Aug. 10, 2005

(87) PCT Pub. No.: WO2004/005947

PCT Pub. Date: Jan. 15, 2004

(65) Prior Publication Data

US 2006/0097730 A1    May 11, 2006

(30) Foreign Application Priority Data

Jul. 9, 2002    (KR) .................... 10-2002-0039788

(51) Int. Cl.
    *G01R 31/08* (2006.01)
(52) U.S. Cl. ...................................... 702/59; 324/539
(58) Field of Classification Search ............ 702/58–59, 702/66, 75, 79; 324/512, 520, 527–528, 324/532–535, 539, 543, 642
See application file for complete search history.

(56) References Cited

U.S. PATENT DOCUMENTS

| 5,376,888 A | 12/1994 | Hook ......................... 324/643 |
| 5,726,578 A | 3/1998 | Hook ......................... 324/643 |
| 5,751,149 A * | 5/1998 | Oberg et al. ................. 324/533 |

(Continued)

*Primary Examiner*—Hal Wachsman
*Assistant Examiner*—Mary Catherine Baran
(74) *Attorney, Agent, or Firm*—Oblon, Spivak, McClelland, Maier & Neustadt, P.C.

(57) ABSTRACT

An apparatus and method for high-resolution reflectometry that operates simultaneously in both the time and frequency domains, utilizing time-frequency signal analysis and a chirp signal multiplied by a Gaussian time envelope. The Gaussian envelope provides time localization, while the chirp allows one to excite the system under test with a swept sinewave covering a frequency band of interest. High resolution in detection of the reflected signal is provided by a time-frequency cross correlation function. The high-accuracy localization of faults in a wire/cable can be achieved by measurement of time delay offset obtained from the frequency offset of the reflected signal. The apparatus enables one to execute an automated diagnostic procedure of a wire/cable under test by control of peripheral devices.

12 Claims, 10 Drawing Sheets

U.S. PATENT DOCUMENTS

| | | | |
|---|---|---|---|
| 6,177,801 B1 | 1/2001 | Chong | 324/520 |
| 6,377,617 B1 * | 4/2002 | Nara | 375/224 |
| 6,668,041 B2 * | 12/2003 | Kamali et al. | 379/1.04 |
| 6,868,357 B2 * | 3/2005 | Furse | 702/108 |
| 6,917,888 B2 * | 7/2005 | Logvinov et al. | 702/59 |
| 7,069,163 B2 * | 6/2006 | Gunther et al. | 702/79 |
| 2001/0050629 A1 | 12/2001 | Benway et al. | 342/124 |
| 2002/0085742 A1 | 7/2002 | Bablumyan et al. | 382/124 |

* cited by examiner

TIME-FREQUENCY DOMAIN REFLECTOMETRY APPARATUS AND METHOD

TECHNICAL FIELD OF THE INVENTION

The present invention is a new apparatus and methodology in instrumentation and measurement for detection and localization of the faults in a wire or cable of an electric or electronic system where high level of reliability is required. In particular, the invented apparatus is capable of detection and localization of faults in high resolution based on the time-frequency domain reflectometry methodology that allows one to consider time and frequency simultaneously while the conventional apparatus and methods rely on either time or frequency only. Therefore, the invented apparatus and method achieve higher accuracy in detection and localization of faults in variety types of cable and wire.

THE STATE OF THE ART

The importance of electrical wiring and associated faults has been highlighted by the investigation of several aircraft crashes. A tiny fault on a wire might cause arcing, which may result in serious damages to the overall system. This problem is not limited to commercial aircraft only systems where complicated wiring is involved and higher safely is required, like military aircraft, space shuttle, nuclear power plants and very tall buildings, etc., might face wiring problems. Thus detection of faults with high resolution is required for diagnosis and maintenance of wiring systems.

The detection and localization of faults in electric cable or wire are the important technical task to the instrumentation and measurement engineering, which is an application of cable tester and impedance or network analyzer. Also the cable and wire manufacturers demand high-resolution detection and localization of faults for their product quality assurance.

The reflectometry is a fundamental basis for detection and location of cables sent for diagnosis of a wiring system. The principles of the reflectometry is to compare the transmitted reference signal and the reflected signal from the faults or discontinuity of a conductor for or detection and localization.

The contemporary state-of-art for wiring/cable fault detection can be categorized by time domain analysis and frequency domain analysis. In time domain analysis, time domain reflectometry (TDR) is used, whereas in frequency domain analysis, frequency domain reflectometry (FDR) and standing wave reflectometry (SWR) are utilized The application of the reflectometry is extended to optical known as optical frequency domain reflectometry (OFDR). Each methodology is based on the appropriate analysis of the reference signal and reflected signal either in the time or frequency domain only. Some TDR based commercial electronic devices to test the health of wiring are available in the market. The frequency domain reflectometry (FDR) and standing wave reflectometry (SWR) employ analysis of the reference signal and reflected signal in the frequency domain, and the SWR-based systems are under development.

However, technical problems with these methodologies are the fact that their resolution and accuracy performance for detection and localization are limited, because both time domain reflectometry and frequency domain reflectometry rely on the analysis of the reflected signals in only one domain, either time or frequency.

In TDR a step pulse is applied to the wire/cable under test which is then reflected by any faults present. The time it takes for the reflected signal to make a round trip can then be converted to distance from the knowledge of the velocity of propagation. A drawback of this method is that its resolution is limited by rise time of the pulse wave. Since the energy of the impulse is spread over a broad frequency range, TDR is usually not suitable for investigating the RF properties of a cable, which is important, for example, when dealing with wires/cables used for communication purposes.

On the other hand, FDR often uses a swept frequency signal which allows one to place the energy of the reference or probing signal in the RF band of interest. The FDR detects and locates faults as well as characteristic impedance of an electric conductor by directly measuring the phase differences between an input wave and the reflected wave of the conductor, wherein a sinusoidal wave serves as the reference signs. When a fault is existent in the conductor, a resonance between the two signals is produced. The FDR, being a method for analyzing signals in frequency domain alone, is limited in its resolution by sweep bandwidth. Furthermore, it has a drawback that its accuracy in distance estimation of faults is lowered in the presence of noise as in case of the TDP.

DISCLOSURE OF THE INVENTION

The present invention, conceived in view of the foregoing, aims to provide time-frequency domain reflectometry apparatus capable of architecting an input signal in time-frequency domain fitting to frequency characteristics of a conductor under test. By investigating the reflected and reference signals in time domain as well as in frequency domain simultaneously using time-frequency domain reflectometry using the apparatus.

The new invention of methodology that we introduce is a joint time-frequency domain reflectometry (TFDR) technique can be characterized by its capability which captures many of the advantages of TDR and FDR mentioned previously. The reference signal is a chirp signal, which allows one to apply the RF power in the band of interest. To provide time localization, the chirp signal is multiplied by a Gaussian envelope in the time domain. The design of reference signal in time and frequency domain is the generalization of the contemporary reflectometry in time or frequency domain only time-frequency domain reflectometry can be characterized by time and frequency localization as a mixture of time domain reflectometry and frequency domain reflectometry. For example, under the conditions with no frequency sweep and the duration of the Gaussian envelope is very large, the reference signal of the time-frequency domain reflectometry takes on a pulse-like character reminiscent of the reference signal of TDR. Similarly, for a very small duration of the Gaussian envelope, the reference signal of the time-frequency domain reflectometry corresponds to the swept sinusoidal reference signal of FDR. Therefore, the time-frequency domain reflectometry scheme provides flexible application depending on the physical characteristics of the wire or cable under test. Note that the reference signals in TDR or FDR is constrained in time and frequency domain, respectively.

For the detection and localization, the time-frequency distributions of the reference signal and the reflected signals are calculated. Then these two time-frequency distributions are cross-correlated in the time-frequency domain. The peak in the time-frequency cross correlation function allows one to estimate an accurate round-trip propagation time and, hence, distance, as in classical TDR. However, for a higher-accuracy localization of the fault, the measured arrival time is compensated by the frequency offset of the reflected signal which can be converted into time information. This is an unique feature of the time-frequency domain reflectometry for the high-resolution detection and localization where the time and frequency information is treated simultaneously. Yet, the experiment is carried in an RF band of interest which is relevant for the particular wire/cable under test, as in FDR. The detailed description of the algorithm will be presented in next section.

Another object of the present invention is to provide time-frequency domain reflectometry apparatus having a wide spectrum of applications in geographic/resource surveys, material surface tests, radar/sonar purposes, communication network wirings, optical cable diagnoses, remote explorations, fluid pipe leakage detections, water gauges, etc. in addition to the conventional application in detecting and locating of faults in a conductor, with a new access method in reflectometry for processing signals that allows architecting an input signal and processing thereof in a time-frequency domain.

In order to achieve the above objects, a time-frequency domain reflectometry apparatus for detection and localization is composed of following components: a personal computer (PC) capable of performing main control program of a predetermined time-frequency domain reflectometry, including a device control program that controls control external instrumentation devices for the generation of the reference signal and acquisition of the reflected signs. The system consists of a circulator, the waveform generator and the data acquisition equipment which is connected to a computer with GPIB cable for automatic control of the instruments. The computer controls the waveform generator to produce the Gaussian envelope chirp signal which propagates into the target cable via the circulator. This reference signal is reflected at the fault location and back to the circulator. The circular redirects the reflected signal to the data acquisition equipment. The computer controls and synchronizes the waveform generator and data acquisition equipment, calculates the time-frequency distribution of the reference signal and reflected signals, and executes the time-frequency cross correlation algorithm.

BRIEF EXPLANATION OF THE MAIN FIGURES IN THE DRAWINGS

100: PC
110: Device Control Program
120: Time-Frequency Domain Reflectometry Detection and Estimation Algorithm
130: Processor Control Program
200: Digital Signal Processing (DSP)
300: Reference Waveform Generator
400: Data Acquisition Instrument (DAI)
500: GUI Program
600: Electric Cable/Wire Under Test
700: Circulator

BEST MODE FOR CARRYING OUT THE INVENTION

Now, construction of the present invention is explained below in more detail by describing the implementation of the invention with the accompanying drawings.

Figure 1:
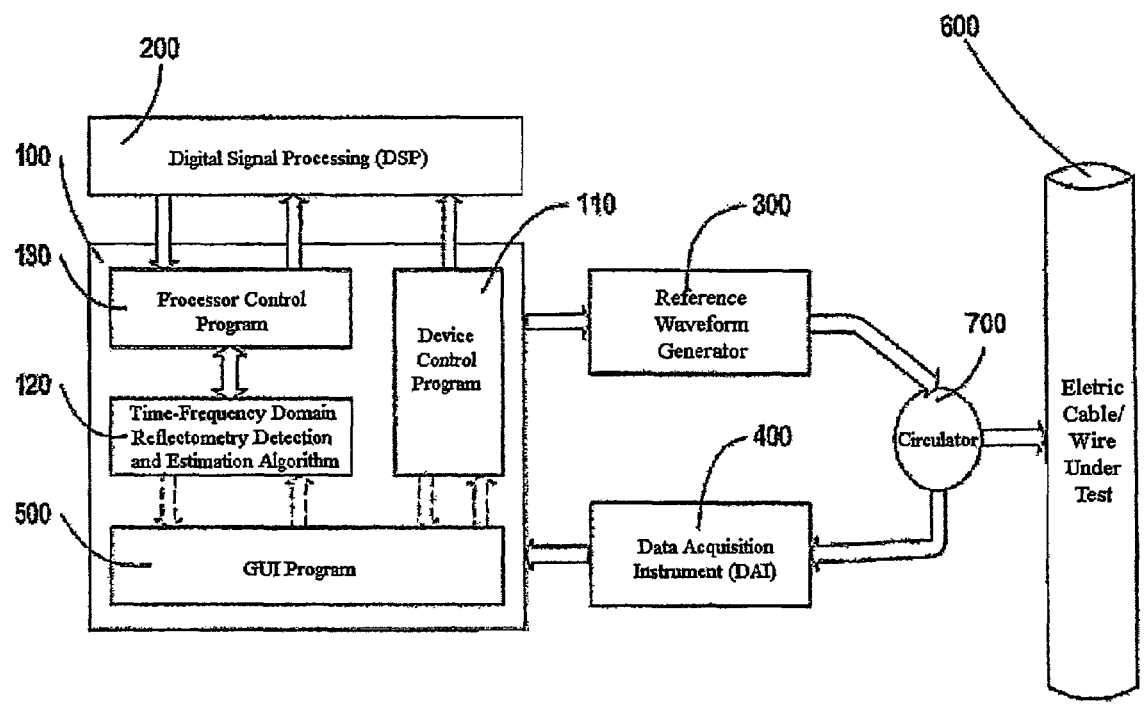
FIG. 1 is a block diagram showing control process in a time-frequency domain reflectometry apparatus in accordance with the present invention.

FIG. 1 is a block diagram showing control process in a time-frequency domain reflectometry apparatus in accordance with the present invention.

As shown above, Numeral 100, which represents a personal computer (PC), is a device where the main program of a time-frequency domain reflectometry apparatus in accordance with the present invention is executed.

Numeral 200, representing a DSP, computes time-frequency distribution functions.

Numeral 300, representing an AWC; generates input reference signals for a wire/conductor under test.

Numeral 400, representing a DAI, acquires reflected signal from a wire/conductor under test as well as input signal generated by an AWG via a circulator, and stores the same.

For the execution of the detection and localization, the above AWG 300 generates input reference signal-chirp signals. A chirp signal is a signal, of which the frequency changes in a linear manner with elapse of time. The chirp signal adopted here is one, of which the frequency rises linearly with time.

Figure 2A:
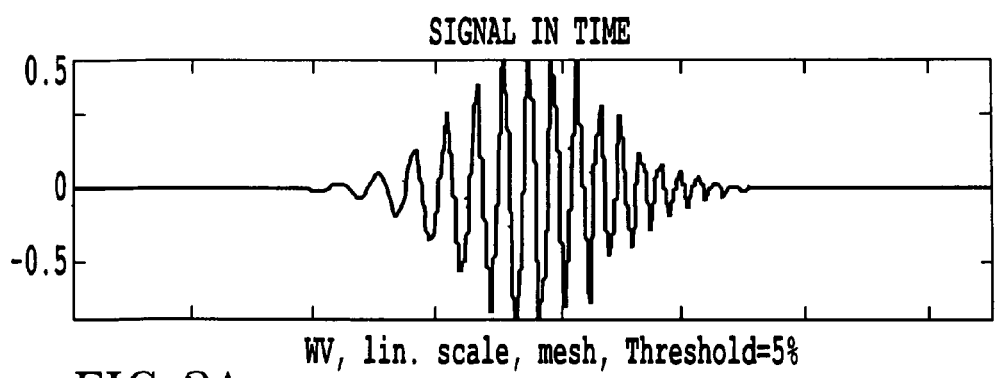
FIGS. 2(a)-2(c) show a time-frequency distribution of a chirp signal with Gaussian envelope which is the reference signal of the time-frequency domain reflectometry apparatus for explanation of the present invention.
Figure 2B:
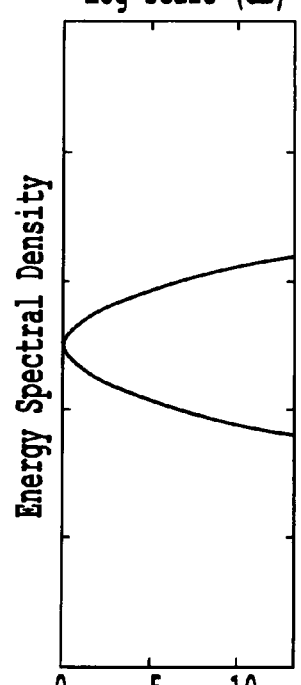
Figure 2C:
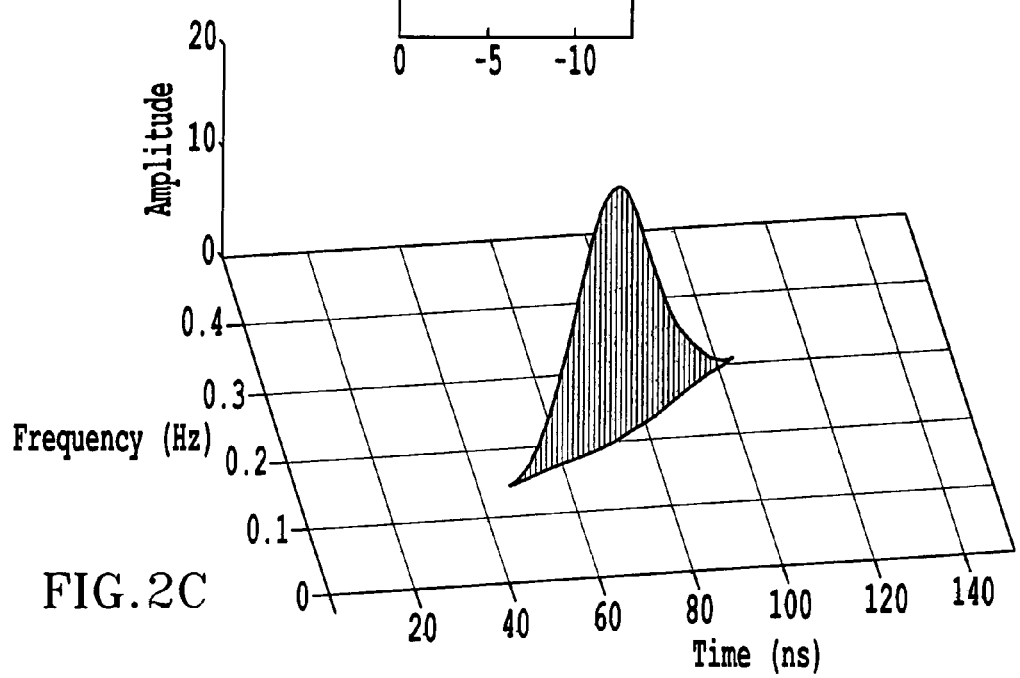

In this invention, the chirp signal is multiplied by the Gaussian envelope so that a localization in time-frequency domain could be accomplished (cf. FIG. 2). An explicit expression of the reference signal to be generated is as follows:

$$s(t)=(\alpha/\pi)^{1/4}e^{-\alpha(t-t_0)^2/2+j\beta(t-t_0)^2/2+j\omega_0(t-t_0)}$$

where t and $t_0$ stand for time and initial time, respectively, α stands for Gaussian constant, β stands for frequency increase rate, and $\omega_0$ stands for angular velocity.

Parameter value for signal generation is applied through the AWG 300 and GPIB programming of the PC 100, while the operations of reference signal generation are controlled by the PC 100. The generated input reference signal thus is applied to the wire/cable under test, and when it confronts a fault, the other parts of the signal are transmitted further. An oscilloscope captures the reflected wave as well as the transmitted wave from each channel, and then displays them on a screen, which operation is performed also by GPIB programming Also the acquired data is stored as a numerical file which is transferred to the PC 100 for the execution of the detection and localization algorithm The parameter values of the input reference signal can be modified by the PC 100 in accordance with the attenuation characteristics of a wire/cable under test even during a triggering operation.

Figure 4:
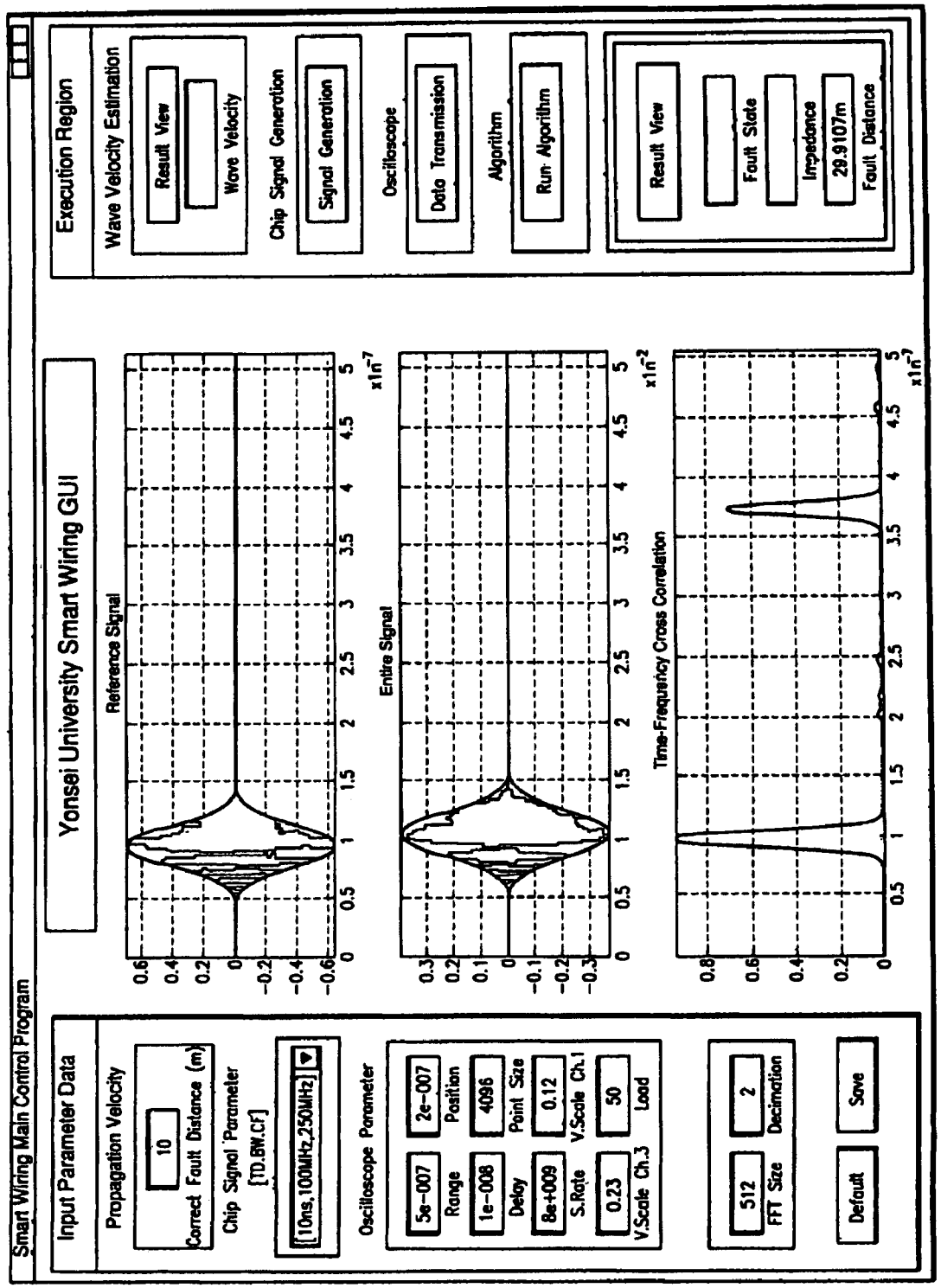
FIG. 4 shows an example of screen snapshot for GUI program control in accordance with the present invention.

The process control program 130 receives the two files inputted from the PC through a GPIB cable and transmits the same to the DSP 200. The DSP 200 compares signal [S(t)] information with data fetched from the oscilloscope to detect faults in the wire/cable under test, computes to localize the faults using a time-frequency domain reflectometry detection and estimation algorithm 120 of the DSP program. An easy control of the PC 100 as well as of external devices, such as monitor, key board, buttons, etc. could be enabled using the GUI program 500. With the GUI program 500, parameter values for different conductors 600, input wave, output wave, etc. can be displayed on a monitor as shown in ① of FIG. 4, architecture of a desired chirp signal can be substituted by input of parameters as in ② of FIG. 4, the wave forms of input signal and output signal can be represented visually as in ③ and ④ of FIG. 4, visual analysis as well as representation of a resulting value in numerals are also enabled as in ⑤ of FIG. 4, and control of entire external devices through simple keyboard inputs and button clicks are enabled.

Figure 3:
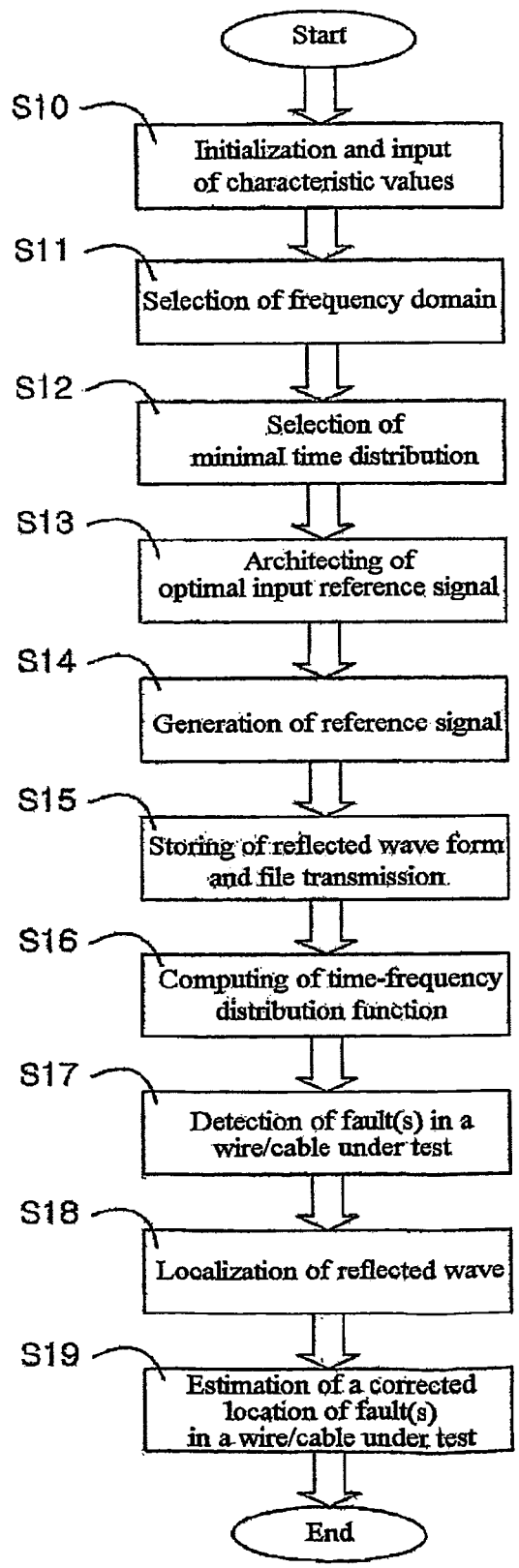
FIG. 3 is a flow chart shows process of algorithm in a time-frequency domain reflectometry method in accordance with the present invention.

FIG. 3 is a flow chart showing control process in a time-frequency domain reflectometry method in accordance with the present invention. As shown in the drawing, a time-frequency domain reflectometry method as per the present invention, i.e. a method for detecting and locating faults in an electric wire/cable under test in accordance with the present invention comprises the step: of inputting (S10) values for physical and electric characteristics of a wire/cable under test 600 under test using GUI, after the wire/cable under test has been connected to a system via a cable and then the system has been initialized; of selecting a frequency domain (S11) suitable to the estimated characteristics of the wire/cable under test in a frequency domain, after size and phase of a reflected wave in the frequency domain has been estimated on the basis of an inputted value of the wire/cable under test; of selecting a minimal time distribution (S12) that satisfies the uncertainty principle between the selected frequency and the time in the above selected frequency domain; of architecting an optimal input reference signal (S13) through multiplication of a Gaussian envelope of the selected time distribution by a chirp signal occupying the selected frequency domain; of generating the reference signal (S14) by an AWG 300 for a wire/cable under test 600 to be tested physically, after the above architected wave form has been transmitted to the AWG 300 via a GPIB; of storing wave form of the reflected wave (S15) passed through the wire/cable under test 600 from the DAI 400 and transmitting the wave form to the inner program in form of a file simultaneously with the above step of generating reference signal; of computing a time-frequency distribution function (S16) from the received wave form signal by the DSP 200 for a rapid calculation; of detecting faults (S17) in the wire/cable under test 600 considering the inputted electromagnetic characteristics of the wire/cable under test after time-frequency cross correlation functions have been computed from the input signal and the time-frequency distribution functions of the reflected wave; of localizing the reflected wave (S18) using the time-frequency correlation function, if any fault is diagnosed; and of estimating the correct location of faults in the wire/cable under test (S19) after localized time delays, frequency displacements of the reflected wave have been computed from marginal of the time-frequency distribution function for the above localized signal, and then the signal distortions have been compensated by time-frequency increase rate of the architected signal.

The time-frequency domain reflectometry as above is described in more detail below. The present invention presents an improved input signal and a processing method to realize a higher level of accuracy in comparison to the conventional art. In other words, an input signal as architected in the present invention is a time localized chirp signal having the following characteristics: This input signal is designed as standing wave having a size of Gaussian distribution in time domain as well as in frequency domain so that it could be interpreted in both time domain and frequency domain, and having a limited bandwidth with its frequency changing linearly. Since this signal is shaped to correspond to a Gaussian distribution, it shows a higher accuracy in respect to dispersiveness, pulse spread, noise, and distortion compared to a time domain reflectometry (TDR), which uses pulse wave.

Further, the TDR interprets input wave and output wave in time domain alone for detecting and locating faults in a wire/cable under test while the frequency domain reflectometry (FDR) and the standing wave reflectometry (SWR) interprets the same only in frequency domain. In contrast thereto, an input signal as per the present invention is architected to be interpreted in both time domain and in frequency domain, so that an accuracy higher than that obtained through an interpretation in either one of time domain or frequency domain can be achieved.

Moreover, the present invention provides a time-frequency domain reflectometry (TFDR) for interpretation of an input signal in both time domain and frequency domain. For interpretation in both time domain and frequency domain of an input signal as architected in the preset invention as well as the reflected signal, the present invention uses Wigner distinction, which is a function representing distribution of a signal in time domain and frequency domain. The input signal architected in the present invention can be formulated as follows:

$$s(t) = (\alpha/\pi)^{1/4} e^{-\alpha(t-t_0)^2/2 + j\beta(t-t_0)^2 + j\omega_0(t-t_0)} \tag{1}$$

where α denotes the width determination factor of Gaussian distribution, β denotes the frequency increase rate factor to time. A time center ($t_s$) and a time duration ($T_s$) of a signal on time axis can be obtained using Formula (1):

$$t_s = \int t |s(t)|^2 dt = t_0 \quad T_s^2 = \int (t-t_s)^2 |s(t)|^2 dt = \frac{1}{2}\alpha \tag{2}$$

Further, a frequency center ($\omega_0$) and a bandwidth ($B_s$) on frequency axis can be obtained from Fourier transform (Formula 3)) of the input signal as follows:

$$S(\omega) = \sqrt{\frac{\sqrt{\alpha}}{\sqrt{\pi}(\alpha - j\beta)}} e^{\frac{(\omega - \omega_0)^2}{2(\alpha - j\beta)}} \quad (3)$$

$$\omega_s = \int \omega |S(\omega)|^2 d\omega = \omega_0 \quad (4)$$

$$B_s^2 = \int (\omega - \omega_0)^2 |S(\omega)|^2 d\omega = \frac{\alpha^2 + \beta^2}{2\alpha}$$

In the same manner, a time center ($t_r$) and a time duration ($T_r$) of reflected signal on time axis, a frequency center ($\omega_r$) and a bandwidth ($B_r$) of a reflected signal on frequency axis can be obtained using Formula (2) and Formula (4).

Accordingly, in order that an input signal is applied to an object wire/cable under test, the input signal shall be designed to fit to the frequency-dependent attenuation characteristics of the wire/cable under test through selections of parameters $\alpha$, $\beta$, and $\omega_0$ of the signal. A parameter determination process of a signal comprises the following steps of:

1. Obtaining (characteristics of a wire/cable under test by) size and phase difference;
2. Selecting a maximal frequency in view of the size attenuation in frequency domain;
3. Selecting a minimal frequency in view of frequency (band) width of the AWG and of the waveform branching instrument from difference in frequency with the maximal frequency;
4. Determining parameter $\alpha$, after having selected a time domain width larger than the reciprocal of the above selected frequency (band) width; and
5. Determining $\beta$ by computing the frequency increase rate between the lowest frequency and the highest frequency within the selected time duration.

In order to evaluate the normalized time-frequency cross correlation function ($C_{sr}(t)$) for detection and localization, the Wigner distribution of the reference and reflected signals are to be evaluated by the equation as follows:

$$W(t, \omega) = \frac{1}{2\pi} \int s^* \left( t - \frac{1}{2}\tau \right) s \left( t + \frac{1}{2}\tau \right) e^{-j\tau\omega} d\tau \quad (5)$$

where $W_s(t,\omega)$ denotes Wigner Distribution of the input signal. Then the Wigner distribution of the input reference signal is obtained as follows $$W_s(t, \omega) = \frac{1}{\pi} e^{-\alpha(t-t_0) - (\omega - \beta(t-t_0) - \omega_0)^2/\alpha} \quad (6)$$

After evaluation of the Wigner distribution of the input reference and reflected signals, the time-frequency cross correlation function for detection and localization is obtained as follows:

$$C_{sr}(t) = \frac{1}{E_s E_r(t)} \int_{t'=t-T_s}^{t'=t+T_s} \int W_s(t, \omega) W_r(t'-t, \omega) d\omega dt' \quad (7)$$

-continued $$E_s = \int\int W_s(t', \omega) d\omega dt \quad (8)$$

$$E_r(t) = \int_{t'=t-T_s}^{t'=t+T_s} W_r(t', \omega) d\omega dt$$

The time-frequency cross correlation function provided above measures time-varying similarity of the time-frequency distributions between the reference signal and the reflected signal. Therefore, the existence of the reflected signal is to be detected by a quantitative number between 0 and 1. A fault in a wire/cable under test can be diagnosed from existence of such reflected signal.

However, for a high-accuracy localization of the fault, the distortion of the reflected signals is to be analyzed, which is caused by the wire/cable. The distortion of the reflected signal is the intrinsic source of localization error in classical time domain reflectometry and frequency domain reflectometry. However, in time-frequency domain reflectometry, the error caused by the frequency-dependent attenuation can be compensated by the evaluation of the time offset in associated with the frequency offset Consider the propagation of the reference signal in the wire/cable under test.

As the signal propagates along the media with spatial variable x, the waveform will be changed by the transfer function of the media $H(\omega,x)$. Let $u(x,t)$ be a waveform that is observed at a distance, $x$, for a given initial condition, $u(x,t)=s(t)$, then, the general solution of the $u(x,t)$ is, $$u(x, t) = \frac{1}{\sqrt{2\pi}} \int S(\omega, x) e^{-j\omega t} d\omega \quad (9)$$

Thus, an input signal in a frequency domain after having progressed by x can be represented through a multiplication of the initial input signal by transfer function of the medium. Furthermore, since a transfer function of the medium is determined by $\alpha(\omega)$: frequency-dependent attenuation, $k(\omega)$: dispersion, the following Formula can be obtained:

$$H(\omega,x) = Ce^{-(\alpha(\omega) - jk(\omega))x} \quad C: \text{normalization factor} \quad (10)$$

Therefore, the input reference signal transmitted by distance x through the media is obtained as follows:

$$H(x, t) = \frac{1}{\sqrt{2\pi}} \int S(\omega, x = 0) H(\omega, x) e^{-j\omega t} d\omega \quad (11)$$

When the input signal propagates through a wire/cable without the frequency-dependent attenuation, the transmitted signal maintains a shape identical with that of the initial signal with only a time delay, $t_d$ corresponding to the propagation distance in the wire/cable under test. However, the input reference signal suffers a frequency-dependent attenuation in the transmission through the medium, i.e., wire/cable under test in this experiment. In particular, attenuation of high frequencies becomes apparent in wire/cable under tests, which phenomenon causes shifts of the time center on time axis and the frequency center on frequency axis of the input signal to new $t_{u(x)}$, $\omega_{u(x)}$, respectively, leading to errors in localization of the faults.

Since the input signal is architected to be in a linear section of $\alpha(\omega)$ and $k(\omega)$, $\alpha(\omega) \cong A\omega$, $k(\omega) \cong K\omega$ can be assumed. Thus, a time center on a new time axis, $t_{u(x)}$ of the input signal as transmitted through the medium can be obtained as follows:

$$t_{u(x)} = \int t|u(x,t)|^2 dt \quad (12)$$

$$= \text{Re}\left[\int S^*(\omega, x)\left(-\frac{1}{j}\frac{\partial}{\partial \omega}S(\omega, x)\right)d\omega\right] = Kx \quad (13)$$

where $v$ denotes progression speed of the input signal in the medium when the frequency is $\omega_{u(x)}$. The center frequency, $\omega_{u(x)}$ on frequency axis can be obtained in the same manner as follows:

$$\omega_{u(x)} = \int \omega |S(\omega)|^2 d\omega \quad (14)$$

$$= \omega_0 - \frac{\alpha^2 + \beta^3}{\alpha}Ax = \omega_0 - \delta\omega \quad (15)$$

Therefore, the delay time compensated by $\beta$ factor and $\delta\omega$ of the chirp signal, which is the input signal of real wave is as follows:

$$t_d = t_{u(x)} - t_s + \frac{\delta\omega}{\beta} = \Delta t + \delta t \quad (16)$$

Figure 5:
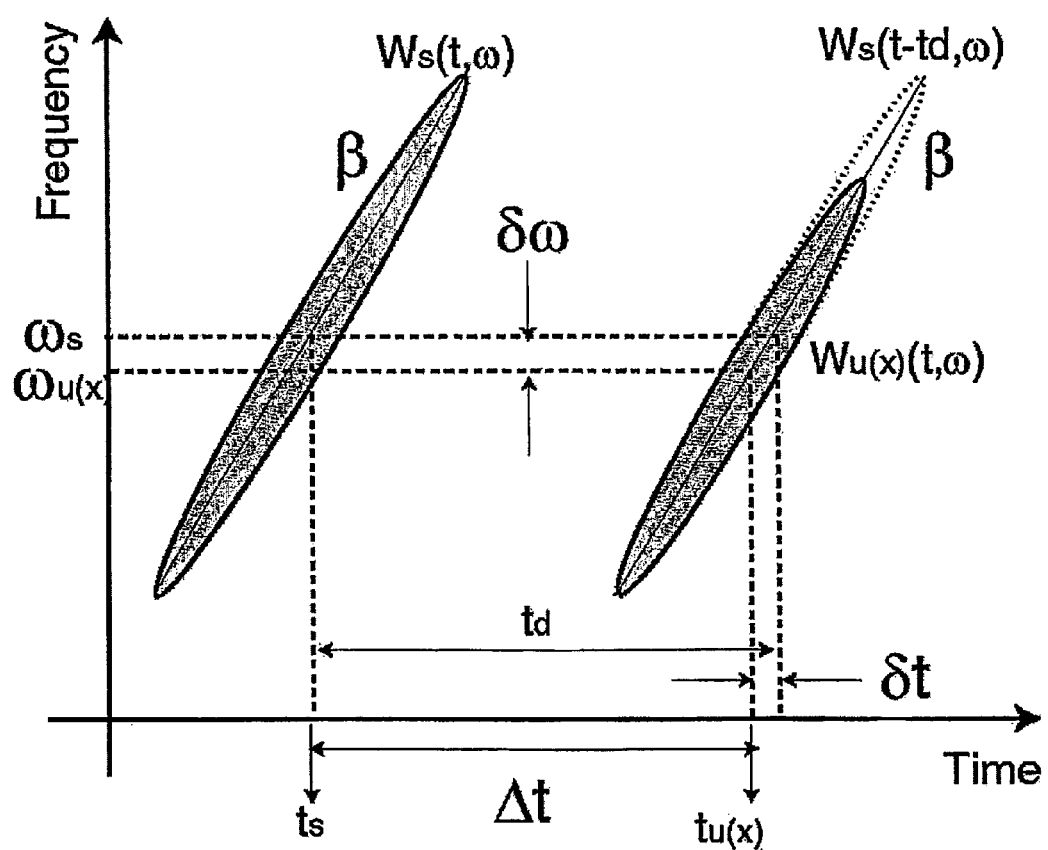
FIG. 5 depicts time-frequency domain distributions of $W_s(t,\omega)$ (reference signal), $W_s(t-t_d,\omega)$ (transmitted signal), and $W_{u(x)}(t,\omega)$ (reflected signal) in accordance with the present invention.

By summarizing the values obtained above, we can obtain a time-frequency domain distribution chart as illustrated in FIG. 5. Information on the location of faults in a wire/cable under test ($d_f$) as well as on the total length of the wire/cable under test ($d_t$) can be obtained from the above data as follows:

$$d_f = \frac{v \cdot t_d}{2}, d_t = v \cdot t_d \quad (17)$$

Figure 6:
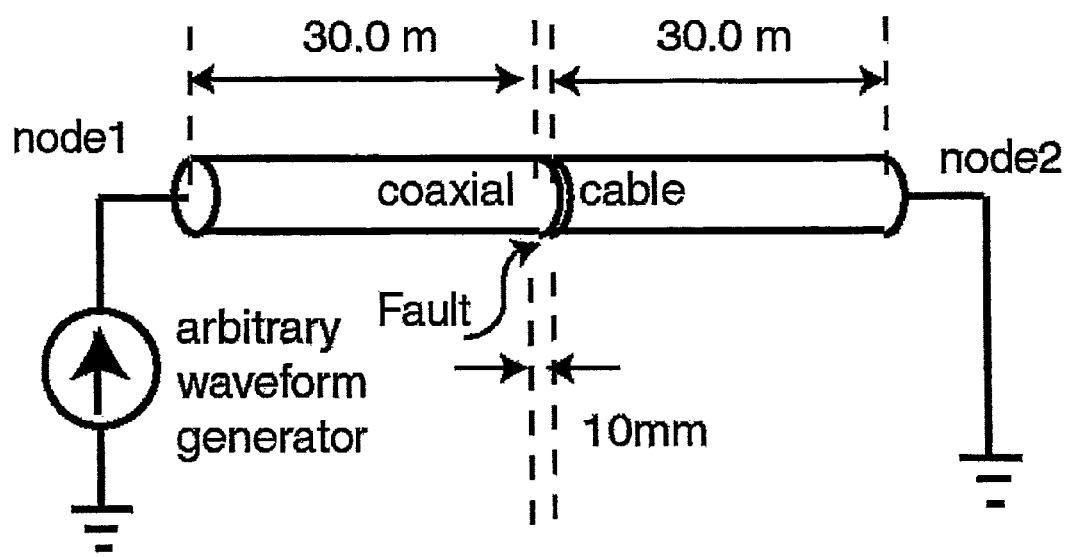
FIG. 6 depicts an experimental simulation setup for a faulty coaxial cable testing simulation in accordance with an embodiment of the present invention.
Figure 7:
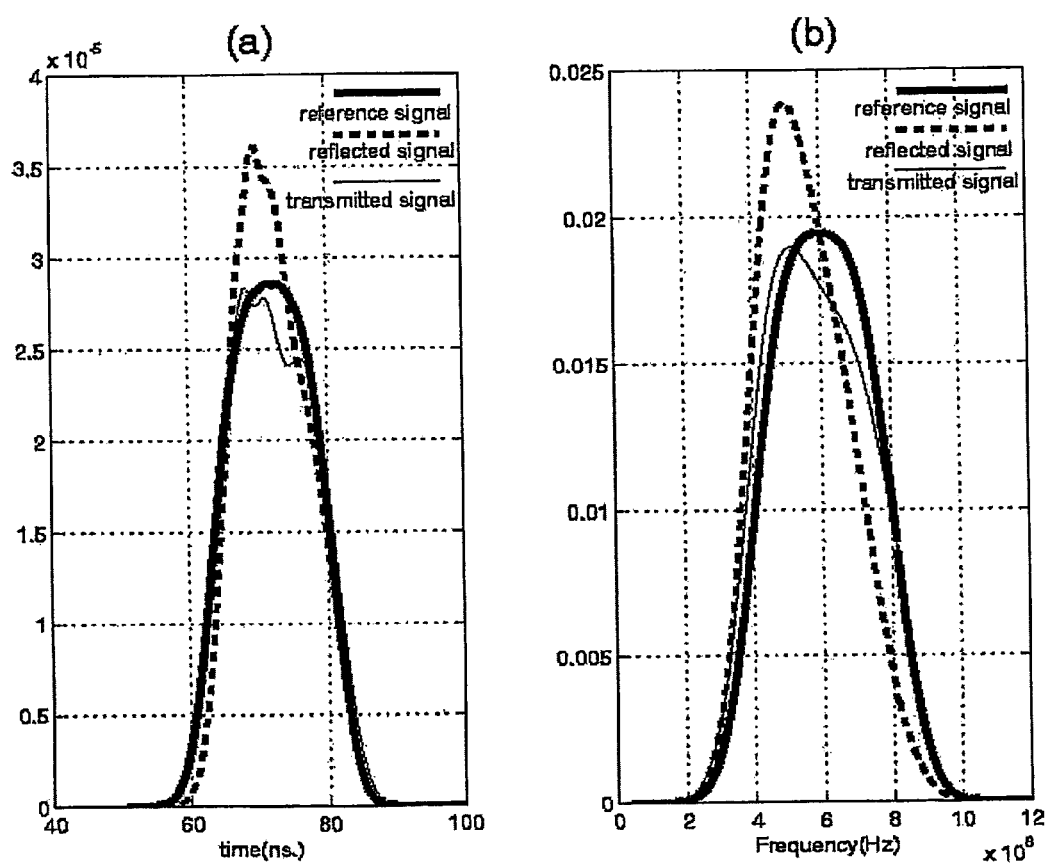
FIG. 7 shows time (a) and frequency (b) marginals of the time-frequency distributions of the individual signals in the experiment described in FIG. 6. (Note that the individual distributions are normalized for illustration. Time centers are shifted to that of the reference signal.)
Figure 8:
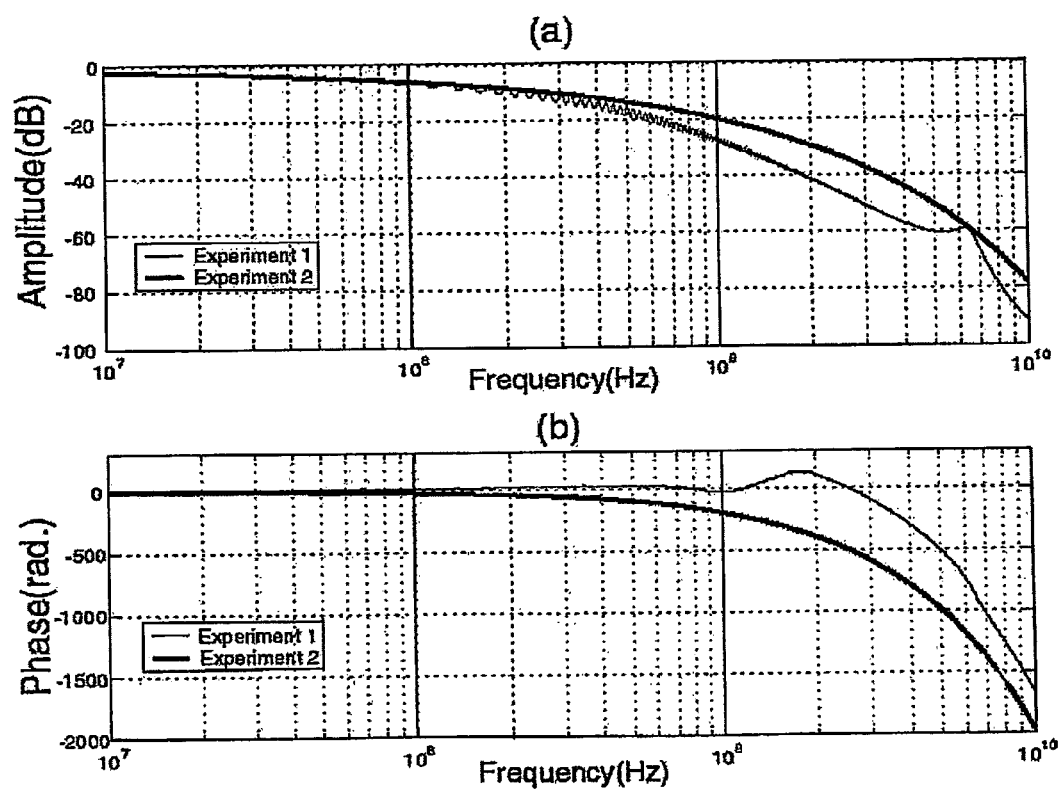
FIG. 8 illustrates frequency response of the coaxial cable for normal and faulty state in amplitude in (a) and phase (b) characteristics of the conductor under experiment of FIG. 6.
Figure 9:
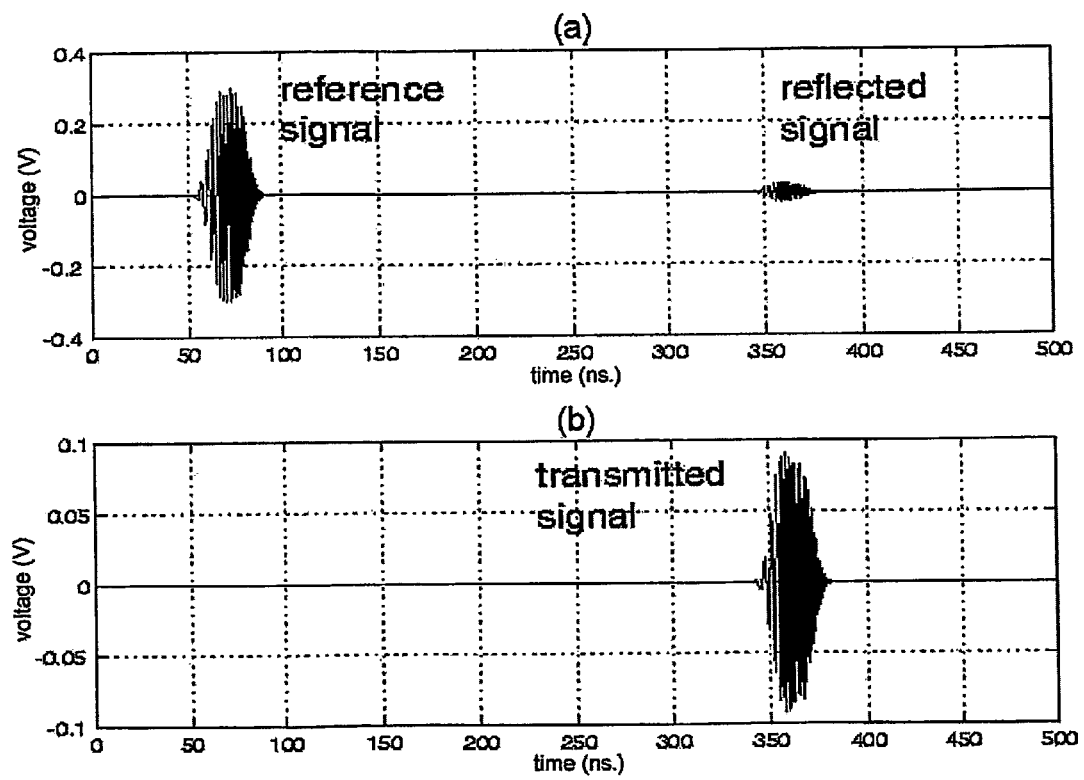
FIG. 9 illustrates the reflected waveform of the faulty coaxial cable in time domain at node 1 with fault in (a) and transmitted waveform in time domain without fault at node 2 in the experiment of FIG. 6.

FIGS. 6, 7, and 8 show experiment conditions for actual experiments of a wire/cable under test in accordance with an implementation of the present invention. FIG. 6 shows a schematic construction of experiment for a wire/cable under test to be tested in accordance with an implementation of the present invention. FIG. 7 illustrates time domain (a) and frequency domain (b) marginals of the time-frequency distributions of the individual signals in FIG. 9. (Note that the individual distributions are normalized for illustration. Time centers are shifted to that of the reference signal.) FIG. 8 illustrates physical characteristics of the wire/cable under test in this experiment in terms of amplitude in (a) and phase in (b).

In the exemplary experiment, an actual wire/cable under test of radio guide (RG)-141 type by advanced design system (ADS) is configured: an input reference signal as designed in the present invention is applied to the wire/cable under test, and then, operations of detecting and locating faults in the wire/cable under test have been performed by processing the inputted signal as well as the reflected signal in accordance with the processing method described above.

Characteristic data of a wire/cable under test in its normal state are easily obtainable from manufacturer of that wire/cable under test. Therefore, the data can be used for design of an appropriate input reference signal e.g. with the following parameters:

Time duration of chirp: 30 ns

Frequency bandwidth: 900 MHz (100 MHz ~ 1 GHz)

Frequency sweep: Linear increasing $\left(\beta = \frac{900 \text{ MHz}}{30 \text{ ns}}\right)$ When the input signal described above is transmitted through the wire/cable under test, information on the reflected signal and the transmitted signal can be acquired from an oscilloscope, at node 1 and node 2, respectively, in FIG. 9. In Table 1, the experimental result data obtained using the time-frequency cross correlation function in Formula (7) are summarized. From the experimental result, localization of the reflected signal alone is obtainable, and from the time-frequency domain distribution of each signal, a time center on time axis, $t_s$, a frequency center on frequency axis, $f_s$, a time duration of the signal $T_s$, and a frequency bandwidth, $B_s$, of each signal can be obtained. The process of obtaining the values on Table 1 can be summarized as follows:

① The time series of reference and reflected signals as shown in FIG. 8 can be acquired by the oscilloscope.

② The existence of the reflected signal is determined by the time-frequency cross correlation function for the localization in time domain.

③ Each signal can be localized through measuring similarities between the input signal and the reflected signal using the time-frequency correlation function, and then classifying them by a threshold value.

Figure 10:
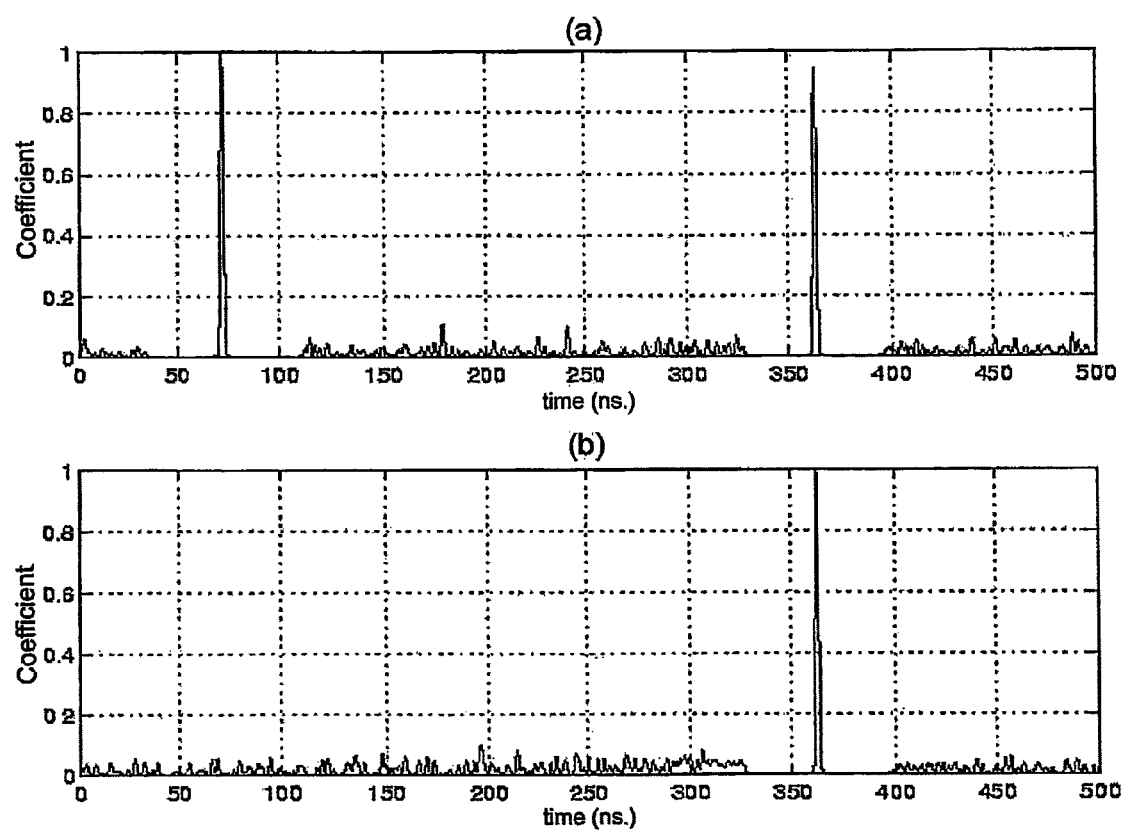
FIG. 10 illustrates the time-frequency cross correlation functions between the input reference signal and the reflected waveform of the faulty coaxial at node 1 with fault in (a) and transmitted waveform without fault at node 2 provided in FIG. 9.

④ Then, each of the localized signal is expressed in a time-frequency domain using Wigner distribution, and projected to time-frequency axis, to obtain a result as shown in FIG. 10.

⑤ The values shown in Table 1 obtained from a result are to be utilized for the time offset evaluation which is to be converted from the frequency offset. The experimental result values obtained by the experiments are summarized in following Table 1:

TABLE 1

|  | Reference Signal | Reflected Signal | Transmitted Signal |
|---|---|---|---|
| Time Center ($t_s$, ns) | 71.94 | 360.11 | 361.14 |
| Time Duration ($T_s$, ns) | 20.17 | 18.30 | 21.05 |
| Frequency Center ($f_s$, GHz) | 0.6039 | 0.5352 | 0.5778 |
| Frequency Bandwidth ($B_s$, GHz) | 0.3960 | 0.3432 | 0.4245 |

Since the relative dielectric constant of the wire/cable under test is $\epsilon_r$=2.1, transmission speed of the input signal in the medium is:

$$v = \frac{c}{\sqrt{\epsilon_r}} = \frac{3 \times 10^8}{\sqrt{2.1}} = 2.07 \times 10^8 \text{(m/sec)} \quad (18)$$

From the time center on time axis of the input signal ($t_s$=71.97) and the time center on time axis of the reflected signal ($t_r$=360.11), a difference of $\Delta t$=360.11−71.94=288.17 (ns) can be obtained. The position of a fault can be localized as follows directly from $\Delta t$ above:

$$d = \frac{v \cdot \Delta t}{2} = \frac{2.07 \times 10^8 \cdot 288.17 \times 10^{-9}}{2} = 29.8256 \text{(m)}$$

The method of localizing a fault by compensating distortion caused by a medium proceeds as follows:

$$\delta t \text{ is } \delta t = \frac{\delta f}{\beta} \text{ in Formula (16)}.$$

Since $\delta t$ represents the difference between frequency center of an input signal and that of a reflected signal, $\delta f$=0.6039−0.5352=0.0687 (GHz). Since $\beta$ was set to 3.00× $10^{16}$ Hz/sec, when the input signal was architected, we can obtain $$\delta t = \frac{\delta f}{\beta} = \frac{0.0687 \times 10^9}{3.00 \times 10^{16}} = 2.29 \text{(ns)}.$$

Thus, a result, $t_d = \Delta t + \delta t = 288.17 + 2.29 = 290.46$(ns)

can be obtained from Formula (16).

From Formula (17), we can obtain a localization of the fault as follows:

$$d_f = \frac{v \cdot t_d}{2} = \frac{(2.07 \times 10^8) \cdot (290.46 \times 10^{-9})}{2} = 30.00 \text{(m)}$$

Since information on the reflected signal is also known from the experiment, information on the total length of the wire/cable under test can be obtained in the same manner.

$\Delta t$, between the input signal and the transmitted signal, can be obtained from Table 1, as $\delta t$=361.14−71.94=289.20 (ns). Likewise, $\delta t$ between the input signal and the transmitted signal can be obtained from $$\delta t = \frac{\delta f}{\beta}.$$

Since the $\delta t$ between the input signal and the transmitted signal is $\delta f$=0.6038−0.5778=0.0261 (GHz), we can obtain:

$$\delta t = \frac{\delta f}{\beta} = \frac{0.0261 \times 10^9}{3.00 \times 10^{16}} = 0.87 \text{(ns)}.$$

Thus, a result, $d_t = v \cdot t_d = (2.07 \times 10^8) \cdot (290.07 \times 10^{-9}) = 60$ (m) can be obtained, which allows us to localize fault in a wire/cable under test with an error range of 0.2%.

Although the present invention has been described above with reference to a specific preferred implementation and wire/cable under test, it should not be confined by the exemplary application, because one of the main feature of the time-frequency domain reflectometry is the design flexibility of the reference signal depending upon the wire/cable under test. However, the feasibility of the high-resolution detection and high-accuracy localization is valid as long as the reference signal is designed in time and frequency domain.

INDUSTRIAL APLICABILITY

As described above, the present invention provides a new time-frequency domain reflectometry (TFDR) method, wherein an input signal is architected to fit to a wire/cable under test considering both time and frequency and then, the input signal as well as the reflected signal from faults in the wire/cable under test are analyzed using a time-frequency analysis method.

Time-frequency domain reflectometry is a new instrumentation and measurement technology based on an advanced signal processing, namely time-frequency analysis. Most contemporary reflectometry instrumentation and measurement devices are based on either the time domain or frequency domain only for detection and localization of faults, and impedance measurement. This limits the performance in accuracy and resolution. However, joint time-frequency domain reflectometry allows one to apply reflectometry in both time domain and frequency domain together so that higher accuracy and resolution can be achieved. Therefore, time-frequency domain reflectometry can be applied to a variety of industries where high precision measurement and testing is required communications, instrumentation & measurement, material engineering, semiconductors and aerospace & aeronautical etc.

In addition to diagnosis of electric conductors, it can be applied to systems requiring high level of security such as aircraft and space shuttle industries, geographic/resources surveys, material surface tests, radar/sonar purposes, communication network wirings, optical cable diagnoses, remote explorations, fluid pipe leakage detections, water gauges, etc., to allow a real-time diagnosis and monitoring of such system, and to enhance stability of the total system, by effectively assisting automatic maintenance of the system. Moreover, the time-frequency domain reflectometry can be directly applied to commercial instrumentation devices for the enhancement of performance, e.g., cable testers and impedance analyzers. Also time-frequency domain reflectometry can provide an improved solution to smart wiring systems and signal integrity problems where high resolution and accuracy are required.

The invention claimed is:

1. A time-frequency domain reflectometry apparatus for detecting and locating faults in an electric conductor comprising:
   a wire/cable to be tested;
   an arbitrary wave form generator that generates a designed input reference signal in time and frequency domain for said conductor under test;
   a data acquisition instrument that stores said reference signal and said reflected signal from said conductor under test, and transmits stored files to a device control program of a personal computer;
   a personal computer (PC) configured to perform a main control program of a predetermined time-frequency domain reflectometry, including:
      a device control program that controls data acquisition devices, determines time delay, voltage offset, and sampling level of a wave form, and architects an input signal, a time-frequency domain analysis control program that analyzes time-frequency domain of said reference signal and of said wave data reflected from said wire/cable, and a digital signal processing control program that receives said files of said reference signal and said reflected wave input at said data acquisition instrument through a general purpose interface bus, and then transmits the files to a digital signal processor; and a digital signal processor that computes with a DSP program of said time-frequency domain analysis control program, to detect and locate faults in said conductor, by calculating time-frequency distribution function of said reflected signal.

2. The time-frequency domain reflectometry apparatus of claim 1, wherein said input reference signal generated by said waveform generator is a chirp signal having a Gaussian envelope with a selected time distribution and a selected frequency domain, of which the frequency changes with time.

3. The time-frequency domain reflectometry apparatus of claim 2, wherein said data acquisition instrument stores data values of said input signal and said reflected signal as two thermal vectors representing a time value and a voltage value, respectively, in a form of files.

4. The time-frequency domain reflectometry apparatus of claim 3, wherein said digital signal processor computes time-frequency cross correlation function from time-frequency distribution function of input signal input from said PC and time-frequency distribution function of said reflected wave; and further computes existence and location of faults in said conductor from said time-frequency cross correlation function.

5. The time-frequency domain reflectometry apparatus of claim 1, wherein said data acquisition instrument stores data values of said input signal and said reflected signal as two thermal vectors representing a time value and a voltage value, respectively, in a form of files.

6. The time-frequency domain reflectometry apparatus of claim 5, wherein said digital signal processor computes time-frequency cross correlation function from time-frequency distribution function of input signal input from said PC and time-frequency distribution function of said reflected wave; and further computes existence and location of faults in said conductor from said time-frequency cross correlation function.

7. A time-frequency domain reflectometry method for detecting and locating faults in an electric conductor, comprising:
architecting an input signal localized simultaneously in a time domain and a frequency domain;
generating said architected input signal;
inputting said generated input signal into said conductor;
receiving a reflected wave reflected from said conductor;
transmitting said received reflected wave to a personal computer (PC);
computing time-frequency distribution functions of said reflected wave and said input signal by measuring said reflected wave of said input signal;
computing a time-frequency cross correlation function of said time-frequency distribution functions of said reflected wave and said input signal;
computing a time difference between a time center of said input signal and a time center of said reflected wave from said time-frequency cross correlation function; and computing a location of any fault or a distance by multiplying a progress speed of wave in said conductor by said time difference.

8. A time-frequency domain reflectometry method for detecting and locating faults in an electric conductor, comprising:
architecting an input signal localized simultaneously in a time domain and a frequency domain;
generating said architected input signal;
inputting said generated input signal into said conductor;
receiving a reflected wave reflected from said conductor;
transmitting said received reflected wave to a personal computer (PC);
computing time-frequency distribution functions of said reflected wave and said input signal by measuring said reflected wave of said input signal;
computing a time-frequency cross correlation function of said time-frequency distribution functions of said reflected wave and said input signal;
computing a time difference between a time center of said input signal and a time center of said reflected wave from said time-frequency cross correlation function; and
computing a location of any fault or a distance by multiplying a progress speed of wave in said conductor by said time difference;
wherein a time duration, a frequency band width, and a frequency center of said input signal is architected considering attenuation characteristics and expected measuring distance of said conductor.

9. A time-frequency domain reflectometry method for detecting and locating faults in an electric conductor, comprising:
architecting an input signal localized simultaneously in a time domain and a frequency domain;
generating said architected input signal;
inputting said generated input signal into said conductor;
receiving a reflected wave reflected from said conductor;
transmitting said received reflected wave to a personal computer (PC);
computing time-frequency distribution functions of said reflected wave and said input signal by measuring said reflected wave of said input signal;
computing a time-frequency cross correlation function of said time-frequency distribution functions of said reflected wave and said input signal;
computing a time difference between a time center of said input signal and a time center of said reflected wave from said time-frequency cross correlation function; and
computing a location of any fault or a distance by multiplying a progress speed of wave in said conductor by said time difference;
wherein said input signal is a chirp signal having a Gaussian envelope with a selected time distribution and a selected frequency domain.

10. A time-frequency domain reflectometry method for detecting and locating faults in an electric wire/cable, comprising:
architecting an input signal localized simultaneously in a time domain and a frequency domain;
generating said architected input signal;
inputting said generated input signal into said conductor;
receiving a reflected wave reflected from said conductor;
transmitting said received reflected wave to a personal computer (PC);

computing time-frequency distribution functions of said reflected wave and said input signal by measuring said reflected wave of said input signal;

computing a time-frequency cross correlation function of said time-frequency distribution functions of said reflected wave and said input signal;

computing a time difference between a time center of said input signal and a time center of said reflected wave from said time-frequency cross correlation function;

localizing time-frequency distribution functions of said input signal and of said reflected signal from said time frequency cross correlation function, computing a time offset by calculating frequency displacement between said input reference signal and said reflected signal, and dividing said frequency displacement between said input signal and said reflected signal by time-frequency increase rate of said architected input signal, after the frequency marginal has been obtained from frequency domain of time-frequency distribution functions of said localized input signal and said reflected signal;

computing a compensated time difference by adding said time difference to said time offset; and computing a location of any fault or a distance by multiplying said progress speed in said conductor by said compensated time difference.

11. A time-frequency domain reflectometry method for detecting and locating faults in an electric wire/cable, comprising:

architecting an input signal localized simultaneously in a time domain and a frequency domain;

generating said architected input signal;

inputting said generated input signal into said conductor;

receiving a reflected wave reflected from said conductor;

transmitting said received reflected wave to a personal computer (PC);

computing time-frequency distribution functions of said reflected wave and said input signal by measuring said reflected wave of said input signal;

computing a time-frequency cross correlation function of said time-frequency distribution functions of said reflected wave and said input signal;

computing a time difference between a time center of said input signal and a time center of said reflected wave from said time-frequency cross correlation function;

localizing time-frequency distribution functions of said input signal and of said reflected signal from said time frequency cross correlation function, computing a time offset by calculating frequency displacement between said input reference signal and said reflected signal, and dividing said frequency displacement between said input signal and said reflected signal by time-frequency increase rate of said architected input signal, after the frequency marginal has been obtained from frequency domain of time-frequency distribution functions of said localized input signal and said reflected signal;

computing a compensated time difference by adding said time difference to said time offset; and computing a location of any fault or a distance by multiplying said progress speed in said conductor by said compensated time difference;

wherein a time duration, a frequency band width, and a frequency center of said input signal is architected considering attenuation characteristics and expected measuring distance of said conductor.

12. A time-frequency domain reflectometry method for detecting and locating faults in an electric wire/cable, comprising:

architecting an input signal localized simultaneously in a time domain and a frequency domain;

generating said architected input signal;

inputting said generated input signal into said conductor;

receiving a reflected wave reflected from said conductor;

transmitting said received reflected wave to a personal computer (PC);

computing time-frequency distribution functions of said reflected wave and said input signal by measuring said reflected wave of said input signal;

computing a time-frequency cross correlation function of said time-frequency distribution functions of said reflected wave and said input signal;

computing a time difference between a time center of said input signal and a time center of said reflected wave from said time-frequency cross correlation function;

localizing time-frequency distribution functions of said input signal and of said reflected signal from said time frequency cross correlation function, computing a time offset by calculating frequency displacement between said input reference signal and said reflected signal, and dividing said frequency displacement between said input signal and said reflected signal by time-frequency increase rate of said architected input signal, after the frequency marginal has been obtained from frequency domain of time-frequency distribution functions of said localized input signal and said reflected signal;

computing a compensated time difference by adding said time difference to said time offset; and computing a location of any fault or a distance by multiplying said progress speed in said conductor by said compensated time difference;

wherein said input signal is a chirp signal having a Gaussian envelope with a selected time distribution and a selected frequency domain.

* * * * *